(12) United States Patent
Sears

(10) Patent No.: US 8,925,886 B2
(45) Date of Patent: Jan. 6, 2015

(54) SUPPORT FOR FLAT RIGID OBJECTS

(76) Inventor: Michael Sears, Dallas, TX (US)

(*) Notice: Subject to any disclaimer, the term of this patent is extended or adjusted under 35 U.S.C. 154(b) by 57 days.

(21) Appl. No.: 13/494,841

(22) Filed: Jun. 12, 2012

(65) Prior Publication Data

US 2012/0312950 A1     Dec. 13, 2012

Related U.S. Application Data

(60) Provisional application No. 61/496,411, filed on Jun. 13, 2011.

(51) Int. Cl.
*A47B 96/00*     (2006.01)
*F16M 13/00*     (2006.01)
*F16M 11/20*     (2006.01)
*F16M 11/04*     (2006.01)
*F16M 13/02*     (2006.01)

(52) U.S. Cl.
CPC ............. *F16M 11/041* (2013.01); *F16M 13/00* (2013.01); *F16M 11/2014* (2013.01); *F16M 13/02* (2013.01)
USPC .................................. 248/309.1; 248/220.21

(58) Field of Classification Search
USPC ................ 248/309.1, 316.1, 316.5, 488, 466, 248/220.21
See application file for complete search history.

(56) References Cited

U.S. PATENT DOCUMENTS

| | | | | | |
|---|---|---|---|---|---|
| 2,951,668 | A | * | 9/1960 | Peterka | 248/466 |
| 3,049,323 | A | * | 8/1962 | Peterka | 248/466 |
| 4,779,180 | A | * | 10/1988 | Ruiz | 362/433 |
| 6,592,088 | B2 | * | 7/2003 | Thompson | 248/220.1 |
| 7,571,881 | B2 | * | 8/2009 | Thompson | 248/220.1 |
| 2004/0216345 | A1 | * | 11/2004 | Wadusky | 40/768 |

* cited by examiner

*Primary Examiner* — Steven Marsh
(74) *Attorney, Agent, or Firm* — Szarzynski Pllc; Jonathan Szarzynski

(57) ABSTRACT

A drop in receptacle for generally flat and rigid objects that is particularly useful for supporting electronic devices such as tablets and smartphones. The support includes corner catches for at least two corners of the device. The corner catches include rotating latches and cornerpieces. The rotating latches are shaped and configured so that they rotate when the corner of an object is pressed against the top surface of the latch. The cornerpieces are shaped to accept and support the corner of the device. After the devices passes the top surface of the latch, the latch returns to its original state and a spring presses the device against the bottom of the latch, securing the device in place.

15 Claims, 17 Drawing Sheets

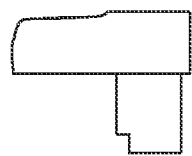
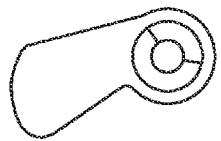
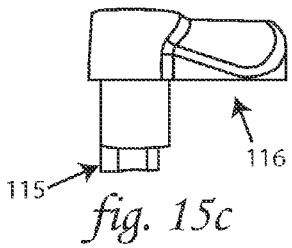
fig. 15a              fig. 15b              fig. 15c
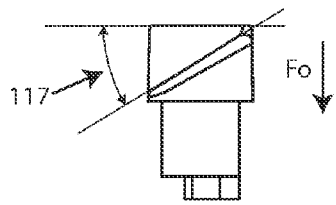
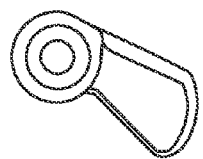
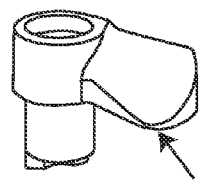
fig. 15d              fig. 15e              fig. 15f
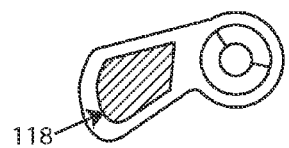
fig. 15g

US 8,925,886 B2

SUPPORT FOR FLAT RIGID OBJECTS

CROSS-REFERENCE TO RELATED APPLICATIONS

This application claims the benefit of provisional application No. 61/496,411 filed on Jun. 13, 2011.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention is in the technical field of supports for generally flat, rigid objects, and is useful for objects that have corners. More particularly, the present invention is in the technical field of supports that secure flat, rigid objects to other objects. The secured objects include laptops, tablets, smartphones, circuit boards, clipboards and other flat rigid objects.

SUMMARY OF THE INVENTION

The present invention is a support for a flat, rigid device that employs the use of shaped, rotating latches, and a spring for pressing the device against the bottom of said latches, to secure the device to the support. The support accepts objects almost instantaneously, and provides for an easy, comfortable, ergonomic, and fast solution to securely support objects such as laptops, tablets, smartphones, circuit boards, clipboards, and other flat, rigid objects.

BRIEF DESCRIPTION OF THE DRAWINGS

FIG. 15a is a back view of a latch;
FIG. 15b is a bottom view of a latch;
FIG. 15c is a front view of a latch;
FIG. 15d is a side view of a latch;
FIG. 15e is atop view of a latch;
FIG. 15f is an isometric view of a latch;
FIG. 15g is a bottom view of a latch.

DETAILED DESCRIPTION OF THE FIGURES

Figure 1:
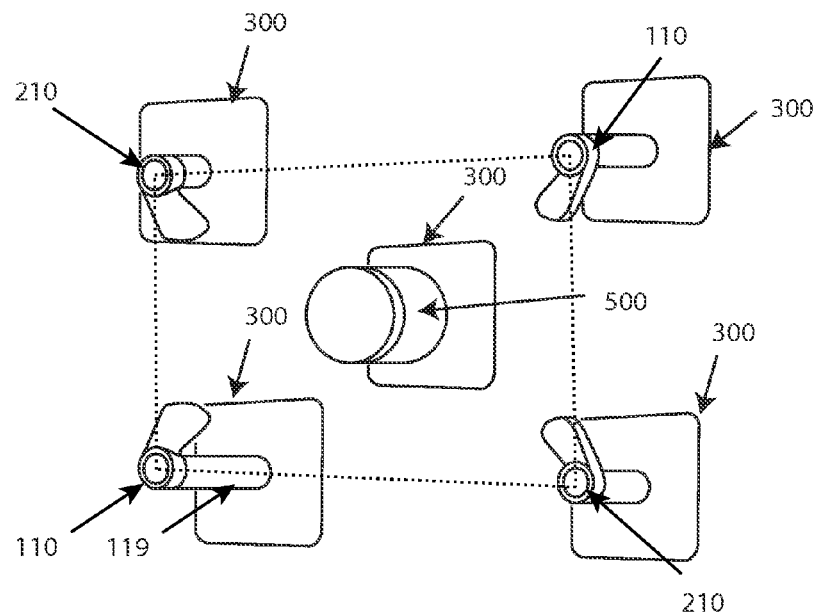
FIG. 1 is a perspective view of a support.

Referring now to FIG. 1, a support for a device is shown. The five small rounded rectangles are a plurality of base 300's. Base 300 may be part of one object, or a series of objects. The primary requirement for base 300 is the ability to have articles attached, particularly the articles shown and described in the following paragraphs. Rotating latches 210 may also be referred to as latch arms. In the preferred embodiment, base 300 is adjustable so that the position of latch 210 can change. Also shown in FIG. 1 is flexible cylinder 119 which provides, among other things, means for creating a space between the bottom surface of the rotating latches 210 and 110, and base 300. Creating a space between the bottom surface of the rotating latches and the base may also be accomplished by the shapes of the base, or the shape of the rotating latches.

Still referring to FIG. 1, spring 500 is shown. Spring 500 is mounted to a surface, and when spring 500 is compressed in one direction, it exerts a force in the opposite direction. Means for compression is also referred to as means for pressing an object against a latch. Spring 500 may be a spring, or a piece of material such as a solid-foam, rubber, or foam-rubber. Spring 500 may have any shape, and there may be multiple instances of spring 500.

Still referring to FIG. 1, rotating latches 110 and adjacent rotating latches 210 are shown. In the embodiment shown, the latches are positioned on the corners of a four-sided polygon. The four-sided polygon is shown by dotted lines connecting the rotating latches by their axes of rotation. Here, opposing latch 110 resides on a corner of the polygon, and on each corner adjacent to rotating latch 110 resides an adjacent latch 210. Finally, another rotating latch 110 resides on the opposite corner.

Figure 2:
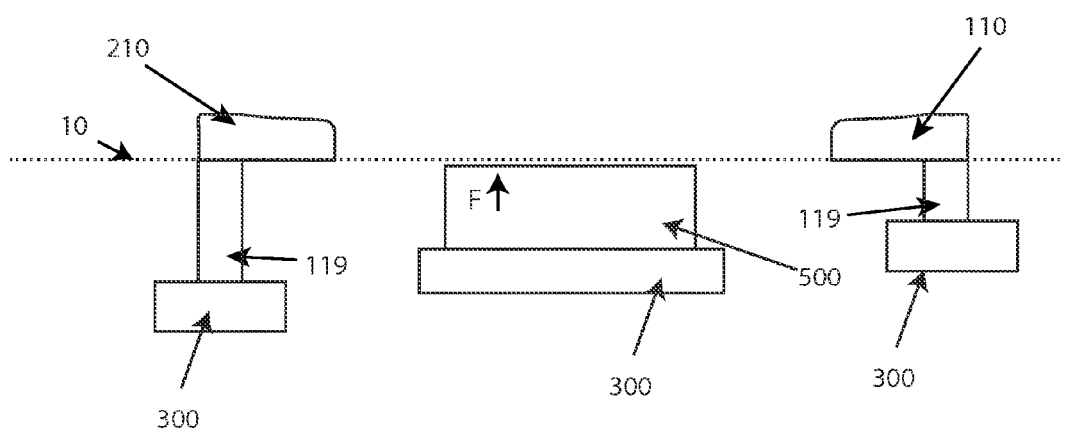
FIG. 2 is a side view of a support.

Referring now to FIG. 2, a side view of a mount is shown. Object plane 10 generally represents a flat, rigid object that the mount is designed to secure. Rotating latch 110 and adjacent rotating latch 210 are shown. At least part of the bottom of said latches reside on object plane 10. The support shown is used to support generally flat objects when said objects, or parts of said objects, reside on the object plane 10. When an object is on object plane 10, spring 500 is compressed, and as a result, spring 500 is exerting a force onto the object. The result is that the object is pressed against the bottom of the rotating latches. In the preferred embodiment, the direction of the force is normal, or approximately normal to the object plane 10. Said force direction is indicated by an arrow next to the letter F.

Still referring to FIG. 2, flexible cylinder 119 is shown. Here, rotating latch 110 and adjacent rotating latch 210 are each attached to a base 300 in a manner that allows said latches to rotate about an axis generally normal object plane 10. Further, flexible cylinder 119 is configured to exert a torque force onto said latches. For example, said latches may be attached to a base 300 using a bolt, nut, washer and a spacer to ensure that the latch may rotate about the bolt. In this example, flexible cylinder 119 is axially aligned with said bolt, and large enough for said bolt and spacer to reside inside of said flexible cylinder. The mounting point is fixed and cannot rotate. The rubber cylinder is attached to the mounting point and attached to said latches creating an equilibrium state for said latches. Thus when said latches receive an external torque force, the flexible cylinder exerts an opposite torque force onto said latches so that when the external torque force is removed, said latches return to their equilibrium state. Here, flexible cylinder 119 provides means for creating an equilibrium state and means for returning a latch arm to its equilibrium state. Further, in the embodiment shown, the flexible cylinder further provides means for creating a space between base 300 and the bottom of the rotating latches.

Figure 3:
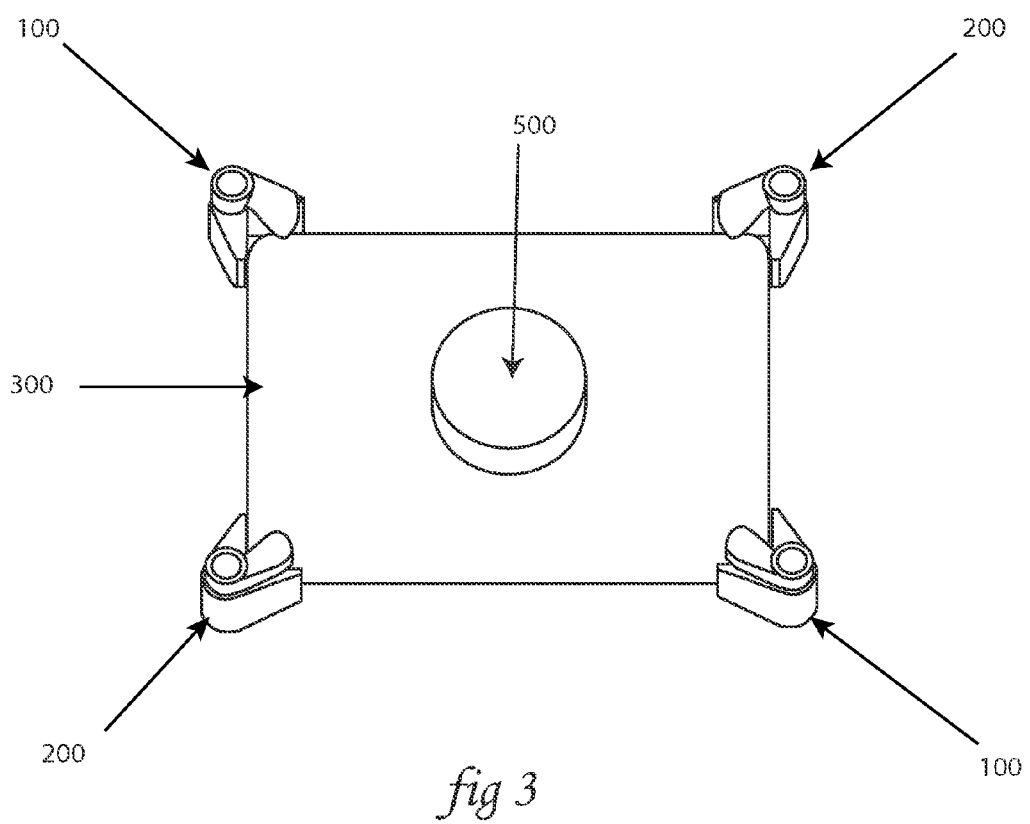
FIG. 3 is a perspective view of the front of a support.

Referring now to FIG. 3, a support is shown where the mounting points are all part of one rectangular piece of material, base 300. The support shown includes base 300, spring 500, corner assembly 100 and adjacent corner assembly 200. In the embodiment shown, base 300 is a rigid or semi-rigid piece of material capable of having objects attached to it. In the embodiment shown, base 300 has a rectangular shape, but it may have other shapes such as an x. Spring 500 may cover a small section of base 300, or base 300 may be covered by multiple instances of spring 500. Further, the end-user of the support may install or remove instances of spring 500 to accommodate a particular device. Spring 500 includes any object that exerts a force when compressed, including but not limited to foam rubber, coiled metal springs, and leaf springs.

Still referring to FIG. 3, corner assembly 100 and corner assembly 200 are shown. The corner assemblies are attached to base 300 by corner attachment 115, further discussed in conjunction with FIG. 6.

In the embodiment shown in FIG. 3, base 300 is part of the support. But other embodiments include a base 300 that is part of another object. For example, base 300 may be a wall, the back of a chair, the top of a table, part of an apparatus such as a mechanical arm, a stand, or any other object or series of objects capable of having parts attached to it.

Figure 4:
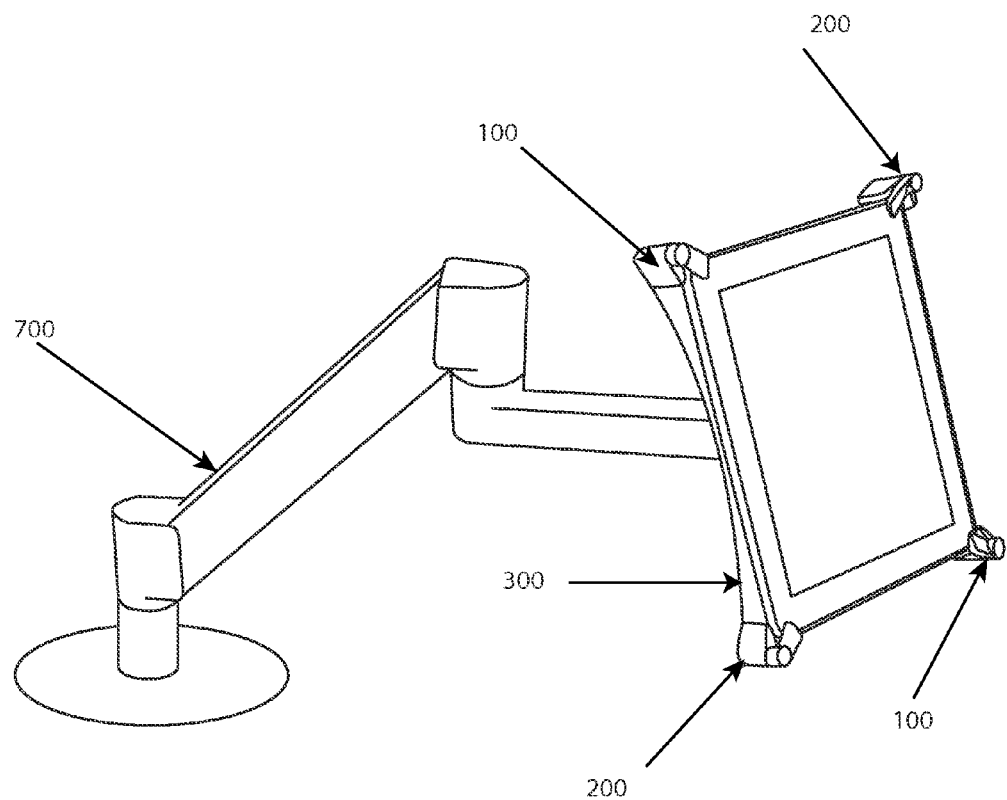
FIG. 4 is a perspective view of the support with an arm.

Referring now to FIG. 4, mechanical arm 700 is shown. In this embodiment, arm 700 is a commercially available arm that is typically used to support computer monitors, but the arm is supporting a tablet PC that weighs much less than the monitor that arm 700 is designed to support. Thus, base 300 is constructed so that it is heavy enough to make-up for the difference in weight. The amount of weight required varies based on the arm used. Further, the addition of weight to base 300 creates a more stable support so that touch input from the end user to control the supported device is less likely to disturb the position of the supported device.

Figure 5A:
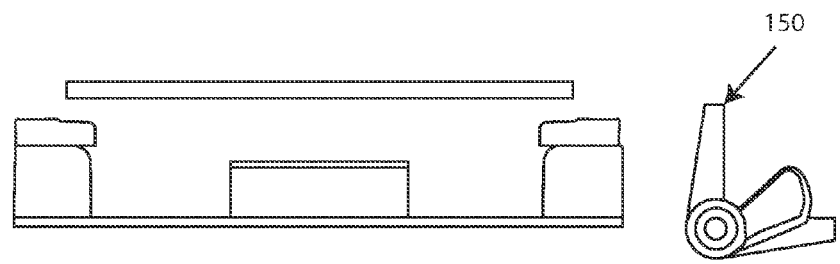
FIG. 5a is a top view of a corner assembly in an equilibrium state.
Figure 5B:
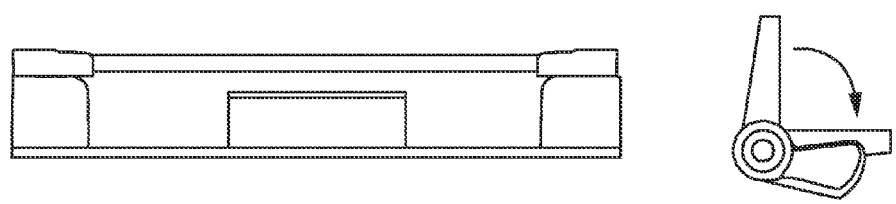
FIG. 5b is a top view of a corner assembly with motion depicted.
Figure 5C:
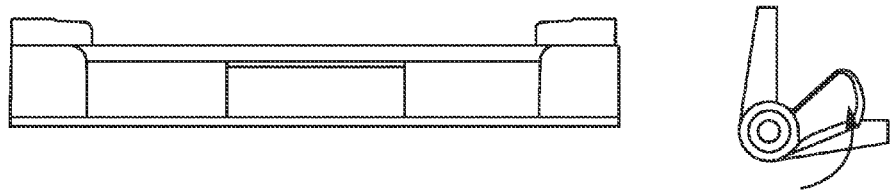
FIG. 5c is a top view of a corner assembly with motion depicted.

Referring now to FIG. 5a, FIG. 5b, and FIG. 5c, the position and movement of a latch arm is shown. In this embodiment, the latch arm is part of a corner assembly, and an L shaped cornerpiece 150 is shaped to accept a generally 90 degree corner. The term L-shape does not limit the shape of cornerpiece 150 to 90 degrees, rather the term is used to denote an angled shape where to lines meet. The smaller angle created by the corner is reflected to as the interior angle, in this case about 90 degrees, and the larger angle created is referred to as the exterior angle, in this case about 270 degree. FIG. 5s shows a latch arm in an equilibrium state, or pre-contact state and over the interior angle of the corner assembly. FIG. 5b shows the latch arm rotating to expose the empty corner area below. An external force is required to move the latch arm out of its equilibrium state. Typically, this external force is imparted onto the latch by a corner of an object that is being placed into the support. Said external force is typically a linear force, thus the preferred embodiment includes latches that are shaped so that a component of the linear force is translated into a torque force. A particular shape is further described in FIGS. 10a-10f. Once the latch is moved out of the way, the object being supported fits under the latch. FIG. 5c shows the latch returning to its equilibrium state. Now, the object is being pressed against the bottom of the latch by spring 500.

Referring back to FIG. 2, spring 500 has a height that is generally equal to or greater than the distance from the surface of base 300 to the bottom surface of latches 110 and 210. But this distance may be more or less depending on the type of object that will be secured by the support and the type of material used for spring 500. Objects are secured to the support by spring 500 being compressed so that spring 500 exerts a force onto the object, and thus the object exerts a force onto the bottom of latches 110 and 210. Latches 110 and 210 are unable to move in the direction of the force exerted by spring 500, and thus, the object is secured in place. FIG. 4 shows an object secured by the support.

Figure 6:
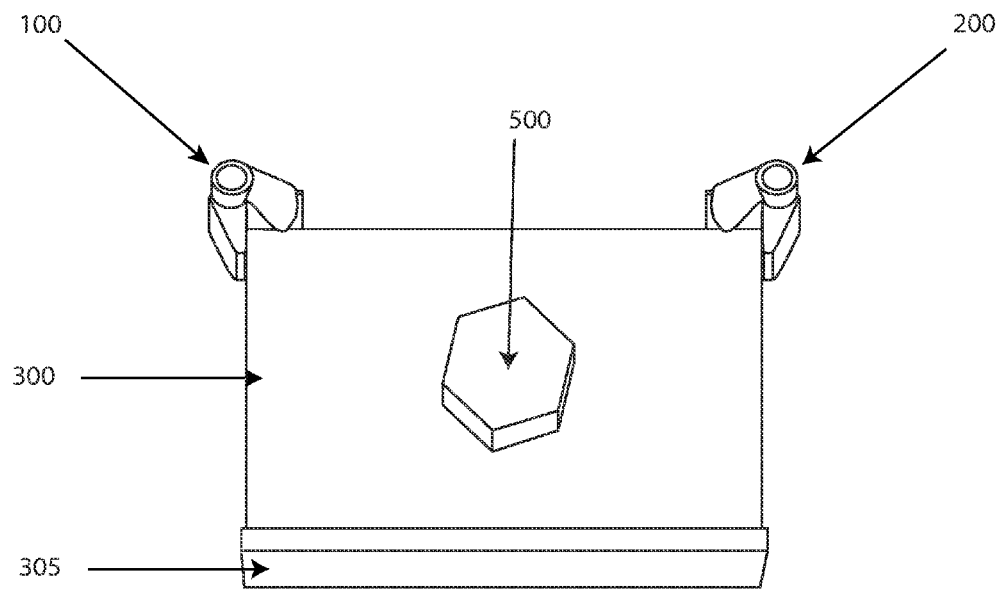
FIG. 6 is a perspective view of the front of a support.

Referring now to FIG. 6, an embodiment is shown where only two latches are used. In this embodiment bracket 305 is used in addition to two corner assemblies to secure an object. Bracket 305 may consist of one piece that is attached to base 300, or multiple pieces that are attached to base 300. Further, base 300 may be manufactured to include bracket 305 as part of a single piece of shaped material. The primary requirement of bracket 305 is to provide a fixed surface for the object being secured to push against as the result of the force being exerted on the object by spring 500.

Figure 7:
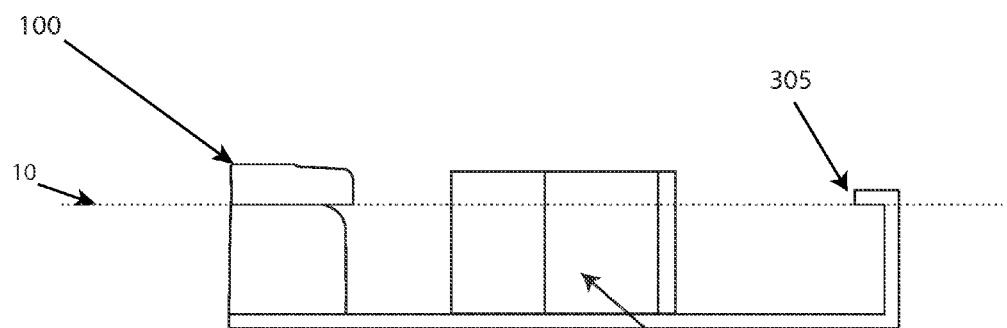
FIG. 7 is a side view of a support.

Referring now to FIG. 7, a side view of a support is shown. Here, bracket 305's bottom surface is on object plane 10, and the top of spring 500 extends past object plane 10.

Figure 8:
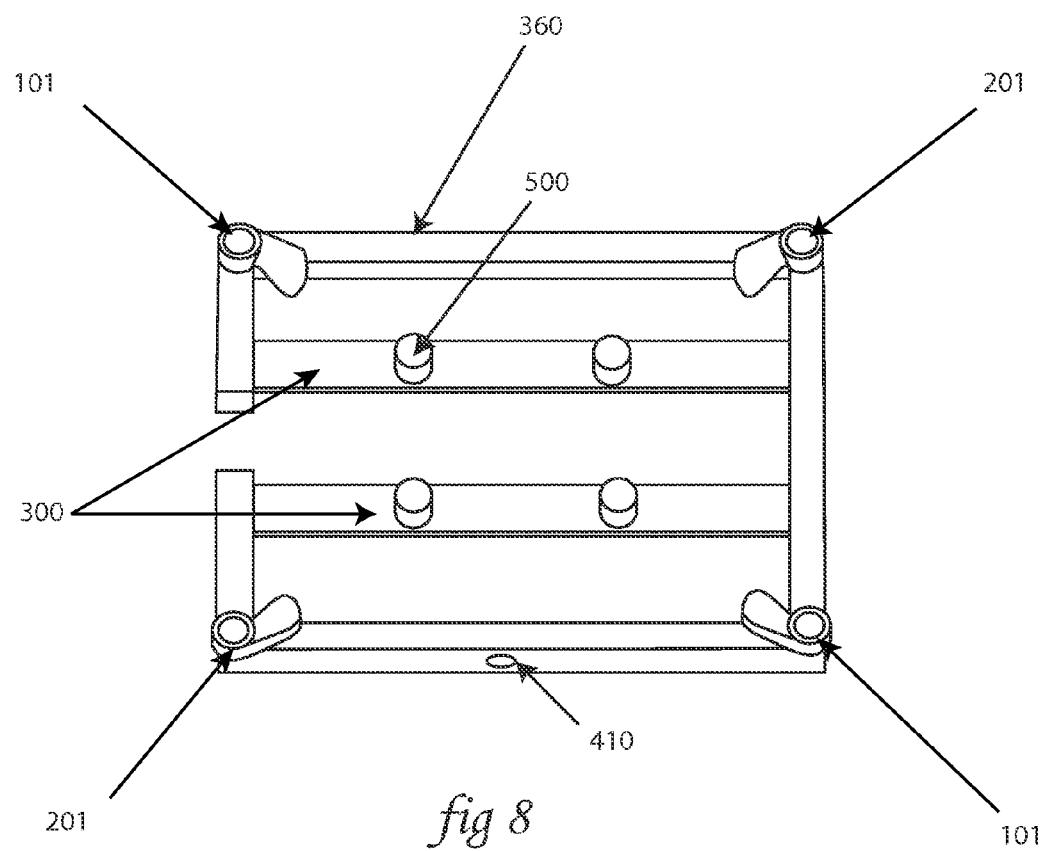
FIG. 8 is a perspective view of the front of a support.

Referring now to FIG. 8, an embodiment is shown where the construction of the support includes a base with a frame 360. In this embodiment, frame corner assemblies 101 and 201 are used. Frame 360 may be one continuous piece, or may be made of multiple pieces. Further, frame 360 may have various openings to allow for access to the object secured by the device. Finally, the embodiment shown uses two base 300's that are attached to frame 360 in order for spring 500 to be positioned appropriately. Other embodiments include spring 500 attached to mounting points that are part of another object.

Still referring to FIG. 8, threaded female mount 410 is shown. This is an example of means for mounting the base to another object. Often, supports are attached to structures using a threaded post that is threaded into a female threaded hole on the support. This system of attachment is included in the embodiment shown. Further, threaded female mount 410 may be part of base 300, top base 301, bottom base 302, or bracket 305.

Figure 9:
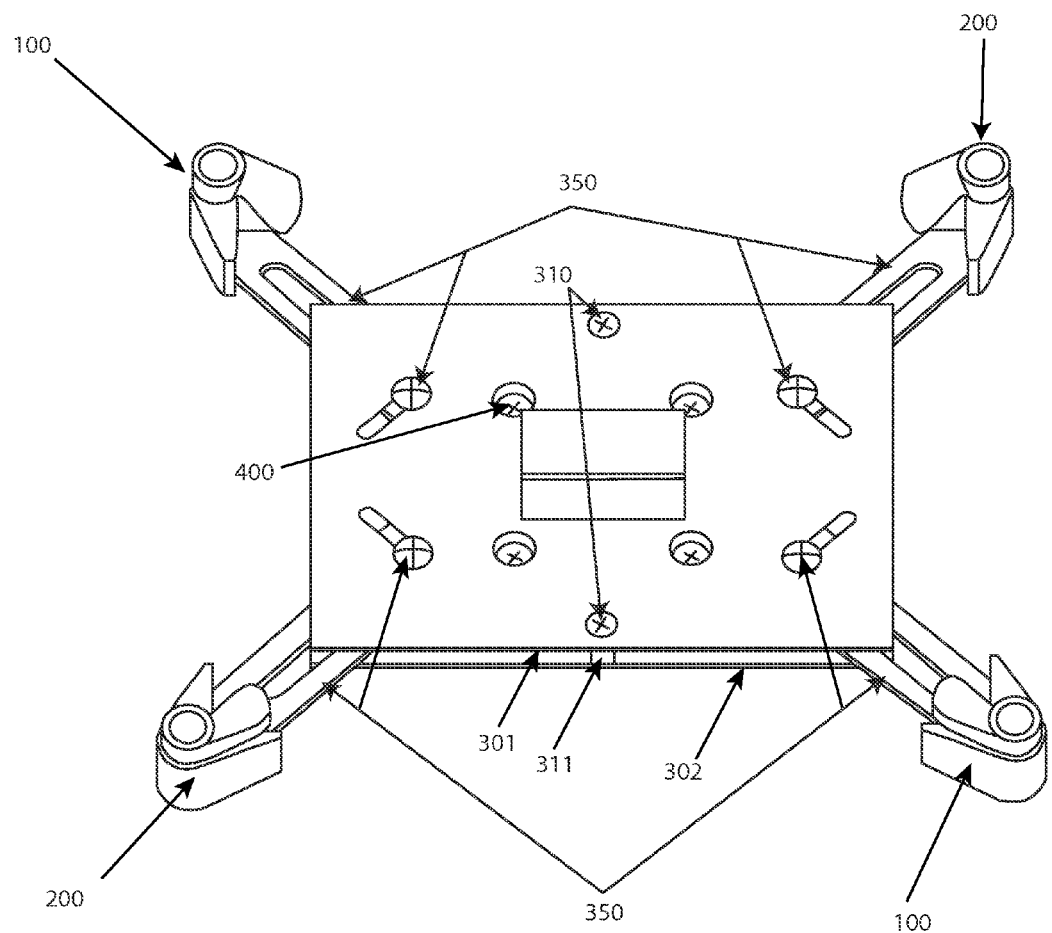
FIG. 9 is a perspective view of the front an expandable support.

Referring now to FIG. 9, an embodiment is shown that has means for adjusting the position of the corner catches 200 and 300, giving the support the ability to adjust in size to accommodate objects of various sizes. This functionality is also termed means for adjusting the position of the cornerpieces. In this embodiment, corner catches 100 and 200 are used, and are attached to corner extensions 350. In addition, this embodiment includes top base 301 and bottom base 302. Top base 301 and bottom base 302 are substantially similar to base 300, and vary only by the changes that are necessary to base 300 to allow for the sandwich construction shown in FIG. 9, and the changes necessary to accommodate corner extension 350. These changes include means to allow for sandwich fastening means 310, such as holes, or threaded holes, and may also include slots to allow for the operation of corner extension 350. Sandwich fastener 310 may be any method used to connect objects including but not limited to holes, bolts and nuts, screws, nails, adhesives, or clamps. Further, sandwich fastener 310 may be used in conjunction with sandwich spacer 311. Sandwich spacer 311 may be any object used to separate top base 301 and bottom base 302 by a desired distance. For example, an embodiment includes sandwich spacer 311 that is a nylon cylinder placed between holes that are part of sandwich fastener 310 so that the hole of the nylon cylinder is generally concentric with the holes of fastener 310.

Still referring to FIG. 9, base fastening means 400 are shown. This is another example of means for mounting the base to another object. For example, the support may be attached to a mechanical arm, or a wall. Further, base fastening means 400 may be configured to be used with existing standards for monitor attachments. For instance, the Video Electronics Standards Association (VESA) has issued VESA Mounting Interface Standards for mounting flat-panel monitors, TVs, and other displays to stands or wall mounts. The most common mounting interface today is a four-hole pattern where the holes are placed on the corners of a 100 mm square. Thus, one embodiment of the support shown in FIG. 9 would include base fastening means 400 consisting of 4 holes placed on the corners of a 100 mm square.

Figure 10:
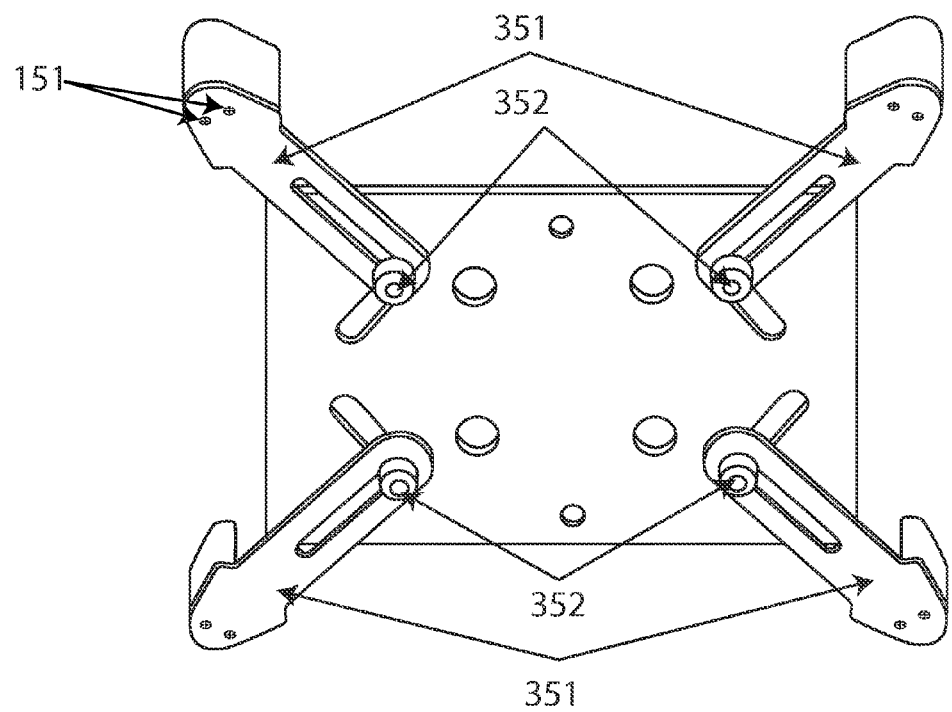
FIG. 10 is a perspective view of the back of an expandable support.

Referring now to FIG. 10, the other side of the embodiment shown in FIG. 5 is shown, except that in FIG. 10 bottom base 302 is not shown. Here, two possible components of corner extension 350 are shown. Extension arm 351 is a rigid or semi rigid piece of material that has a corner assembly attached to it. Extension arm 351 can extend and pivot to locate the corner assembly in a particular point in space. In the embodiment shown, extension arm 351 is attached to top base 301 by extension post 352. Here, extension post 352 is a standard bolt, nut and washer stack. Extension arm 351 has the ability to extend due extension post 352 being placed inside of a slot that is cut out of extension arm 351. Further, extension arm 351 may pivot about extension post 352. In addition, top base 301 may have a slot instead of a hole for extension post 352 to allow for additional adjustment of the position of the corner assembly attached to extension arm 351. Other methods may be used, such as extension arm 351 being constructed to that is has the ability to telescope, and being mounted in a manner that allows for extension arm 351 to rotate.

Still referring to the invention shown in FIG. 10, another embodiment includes using templates for predetermined devices or dimensions. For example, the support may be sold in pieces including top base 301, bottom base 302, and extension arms 351 with corner assemblies attached. Stencils or guides are printed or etched on one side of either base to indicate the location of the extension arms for particular devices, or for particular dimensions of the object to be supported. Then the support may be built by placing extension arms 351 in the proper locations and sandwiching the arms with bottom base 302 and top base 301. The pieces may be held together with adhesives or other attachment means, such as sandwich fastener 310.

Still referring to FIG. 10, the invention is not limited by the use of top base 301 and bottom base 302 when carrying out the adjustable embodiment described. The adjustable embodiment may be built with a single base piece.

Still referring to FIG. 10, means for attaching the corner assembly attachment are shown. Shown are threaded screws 151 that are placed through holes in the extension arm and screw into cornerpiece 150. Other means include threaded bolts, adhesives, and any other means of attaching one object to another.

Finally, means for adjusting the position of the corner-pieces, or corner catches, include various hole positions, or templates on base 300 that represent varying objects.

Figure 11:
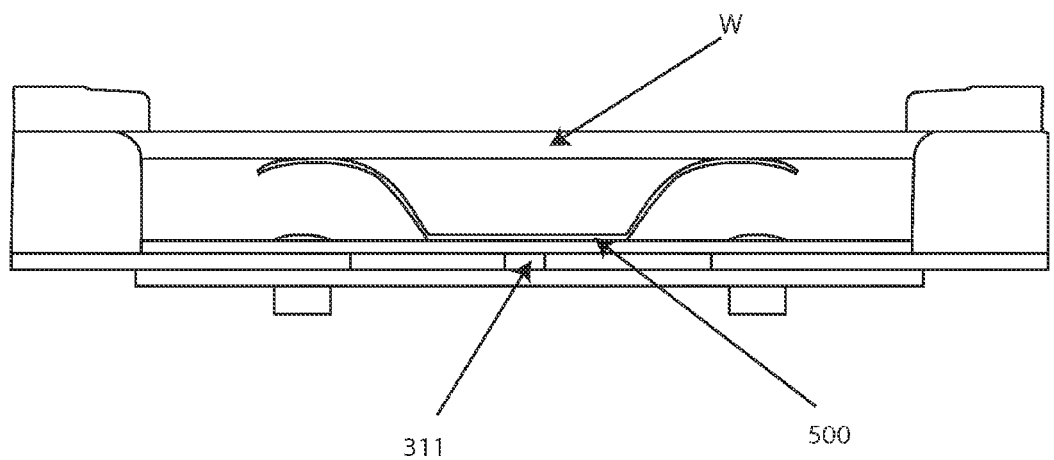
FIG. 11 is a side view of a support in use.

Referring now to FIG. 11, an adjustable embodiment is shown in use from the side. Here, work piece W is secured to the support. Spring 500 has been compressed and is now exerting a force onto work piece W so that work piece W is pressed against the bottom of rotating latch 110 and adjacent rotating latch 210. In this embodiment, spring 500 is a leaf spring.

Figure 12:
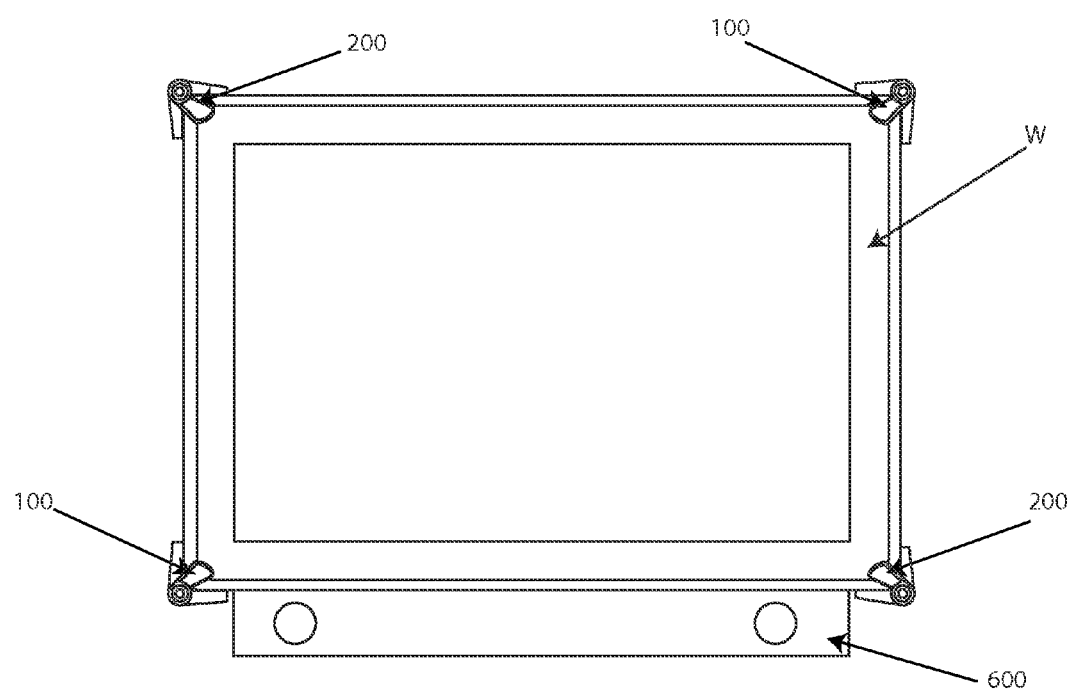
FIG. 12 is a front view of a support.

Referring now to FIG. 12, an embodiment is shown in use from the front. Speakers 600 are shown. Supports for devices that include external speakers are not new. Oftentimes, devices lack the ability to produce sound, or may lack the ability to produce the sound quality desired by the user of the device. Thus, supports for electronic devices often include means for interfacing with the device so that the device can control the audio output of speakers that are integrated into the support. In FIG. 12, this readily available technology is represented by speakers 600. Speakers 600 may be incorporated into the construction of any of the elements of the invention, such as base 300, or speakers 600 may be a separate component that is attached to the support.

Figure 13:
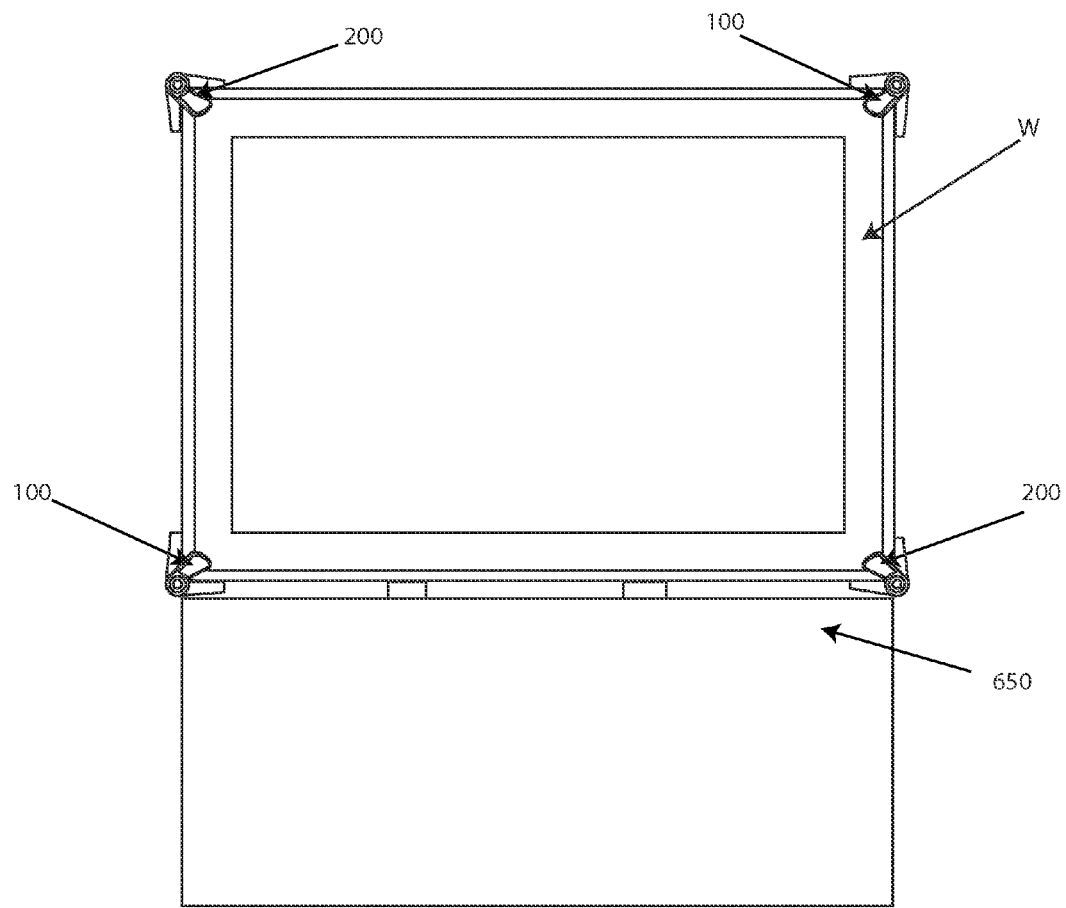
FIG. 13 is a front view of a support.

Referring now to FIG. 13, means for supporting a keyboard are shown. Said means can be any mechanical object attached to the base that is capable of supporting a keyboard. In the preferred embodiment, the means for supporting a keyboard are hingedly attached to the base and use hinges that maintain an angle despite the weight of the keyboard.

Figure 14:
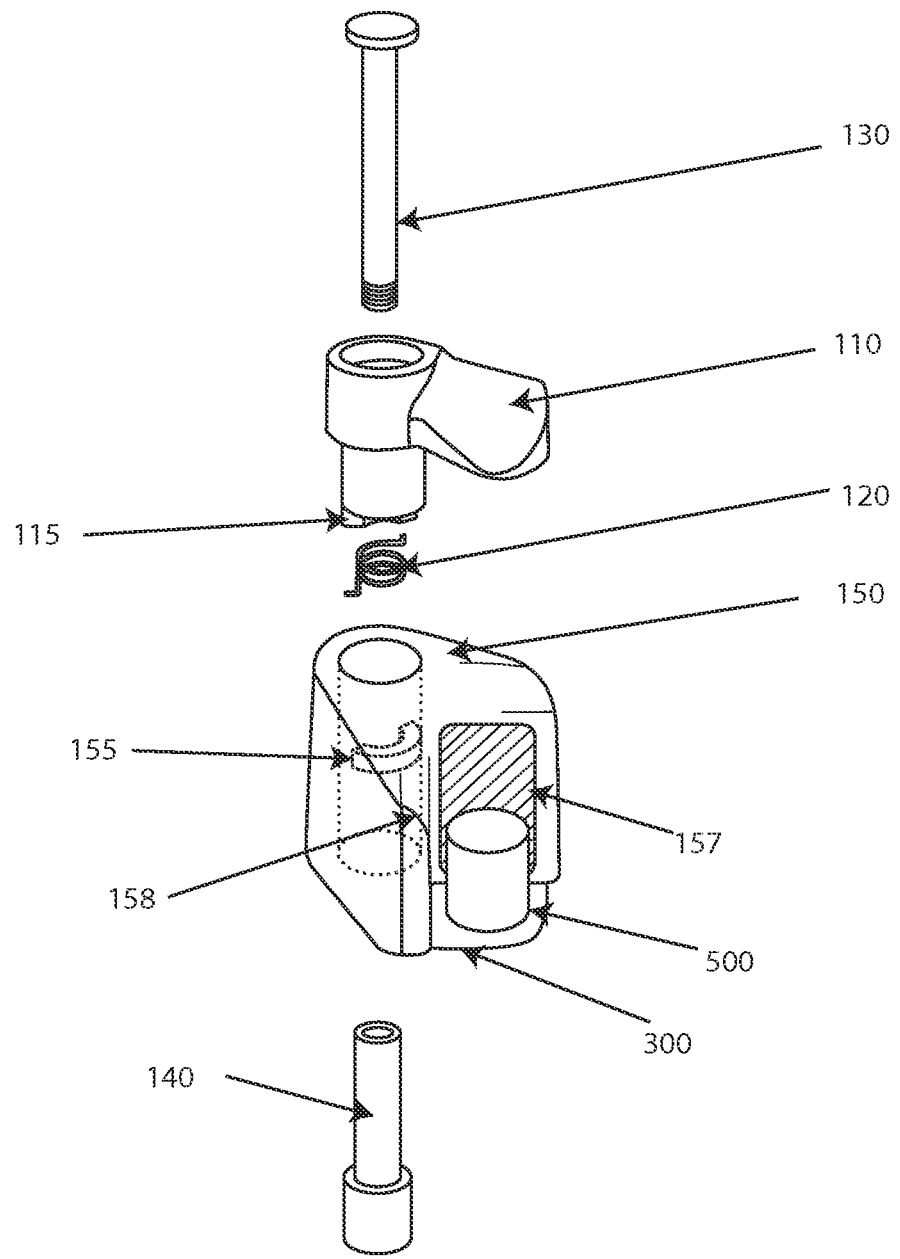
FIG. 14 is a perspective view of a corner assembly.

Referring now to FIG. 14, an embodiment of a corner catch is shown, including descriptions of a method for positioning a latch arm over the interior angle of the cornerpiece. Here, latch 110 is described as having a post section and an arm section, the post section being the generally cylindrical part, and the arm section being the shaped latch that extends generally perpendicularly from the top end of the post. Further, latch 110 has a hole that is generally aligned with the axis of the cylinder section of the latch post. Cornerpiece 150 is shown having a generally cylindrical cavity extending through it, with openings on its top and bottom surfaces.

In this embodiment, latch fastener 130 fits through the hole of latch 110, and threads into axle 140. In other embodiments latch fastener 130 may attach to cornerpiece 150. In addition, latch fastener 130 may provide an axle for rotating latch 110 and other parts of the assembly to rotate about. Finally, fastener 130 has a shape, in this case a head, that does not allow fastener 130 to travel through the hole.

Still referring to FIG. 14, torque spring 120, latch rotation limiter 115, and cornerpiece rotation limiter 155 are shown and act together to provide means for creating an equilibrium state where the latch arm is positioned over the interior angle of the cornerpiece, as shown in FIG. 5a. In this embodiment, torque spring 120 is a spring configured to exert a torque force onto rotating latch 110 and corner-piece 150. Rotating latch 110 can rotate in the opposite direction of the torque force exerted by torque spring 120 when an external force is applied, either when the corner of a device contacts the sop surface of the rotating latch, or when a hand opens the latch. After the external force is removed, torque spring 120 provides means for returning rotating latch 110, also called the latch arm, to the equilibrium state. In the preferred embodiment the rotation limiters are configured to allow for approximately 45 degrees of rotation, as shown in FIGS. 5a-5c. Generally, said rotation is limited in the opposite direction of the torque provided by torque spring 120 to protect torque spring 120 from being over-torqued.

In this embodiment, cornerpiece 150 and rotating latch 110 are constructed so that torque spring 120 has a notch or tab to exert a force onto, in this case, the rotation limiters. In other embodiments, torque spring 120 can be replaced by rubber band, or multiple rubber bands, or any other mechanical method known in the art for exerting a torque force onto a latch. In yet another embodiment, torque spring 120 can be replaced by a material placed between latch rotation limiter 115 and corner rotation limiter 155, so that rotating latch 110 is returned to its equilibrium state after it is rotated. In this embodiment the material used can be compressed, and when it is compressed the material exerts a force opposite of the compression force, such as rubber, or foam rubber.

Still referring to FIG. 14, this embodiment uses axle 140. Generally, axle 140 is a spacer that limits latch fastener 130 so that latch fastener 130 does not press against rotating latch 110, and provides means for pivotally connecting cornerpiece 150 and latch 110. When corner assembly 100 is assembled, axle 140 is inside the opening of rotating latch 110, and latch fastener 130 is threaded into axle 140. The shape of axle 140, and the shape of the hole inside cornerpiece 150 do not allow for axle 140 to travel through cornerpiece 150.

Still referring to FIG. 14, corner pad 157 is shown. In the embodiment shown, corner pad 157 provides vibration dampening and shock absorption when an object is held by the support. Corner pad 157 may be made of foam rubber, or any other type of material that may be used for said purpose.

Still referring to FIG. 14, corner feature 158 is shown. Corner feature 158 aids in the insertion of an object being placed into the support. In its simplest form, corner feature 158 is a chamfered edge, but may also be a fillet, or any other shape besides a 90 degree corner. Corner feature 158 may also be part of frame-like structure 360.

Finally, referring to the discussion thus far about FIG. 14, the discussion has been specific to corner assembly 100. Adjacent corner assembly 200 is the same as corner assembly 100 except that it uses adjacent rotating latch 210; with this in mind, the discussion of corner assembly 100 can be used to construct adjacent corner assembly 200.

Referring now to FIGS. 15a-15g, a series of drawings are shown to illustrate the features of rotating latch 110. FIG. 15c shows latch rotation limiter 115 that is discussed above. In the embodiment shown, rotating latch 110 comprises a cylinder and latch arm 116 that extends outwardly from the cylinder. FIG. 15c identifies latch arm 116. FIG. 10d shows latch arm angle 117. Said angle provides means for translating a linear force into a torque force, in this case an inclined plane. The support is designed to easily accept objects when the objects are placed into the support. Latch arm angle 117, in combination with latch arm 116's rounded shape facilitates this design feature. When an object is being placed into the support, the corner of the object contacts the top of latch arm 116 and generally exerts a linear force onto latch arm 116. This force direction is shown in FIG. 15d and labeled as Fo. Latch arm angle 117 results in the translation of said force into a torque force onto rotating latch 110, so that said latch rotates out of the way so that the object moves under rotating latch 110. Once the object is under the rotating latch 110 there is no longer a torque force on rotating latch 110 and it returns to its equilibrium state.

Still referring to FIGS. 15a-g, the latch is designed to be touched. Said latch has smooth edges, and the means for translating the force of an object has the further benefit of providing an ergonomic solution for releasing the object from the mount. The top of rotating latch 110 has rounded and smooth surfaces. Rotating latch 110 is intended to be touched, thus the surfaces are smooth and rounded.

FIG. 15f particularly points out the bottom edge corner of rotating latch 110. This bottom edge corner is further discussed in conjunction with FIG. 13.

Referring now to FIG. 15g, the bottom of rotating latch 110 is shown. In this embodiment, latch pad 118 is installed. Generally, latch pad 118 is foam rubber, or some other type of resilient insert or attachment. Similar to corner pad 157, latch pad 118 is used to provide for vibration dampening and shock absorption. Rotating latch 110 may be constructed to have a recess for latch pad 118, or latch pad 118 may be attached to rotating latch 110 with adhesives or other attachment means.

Figure 16:
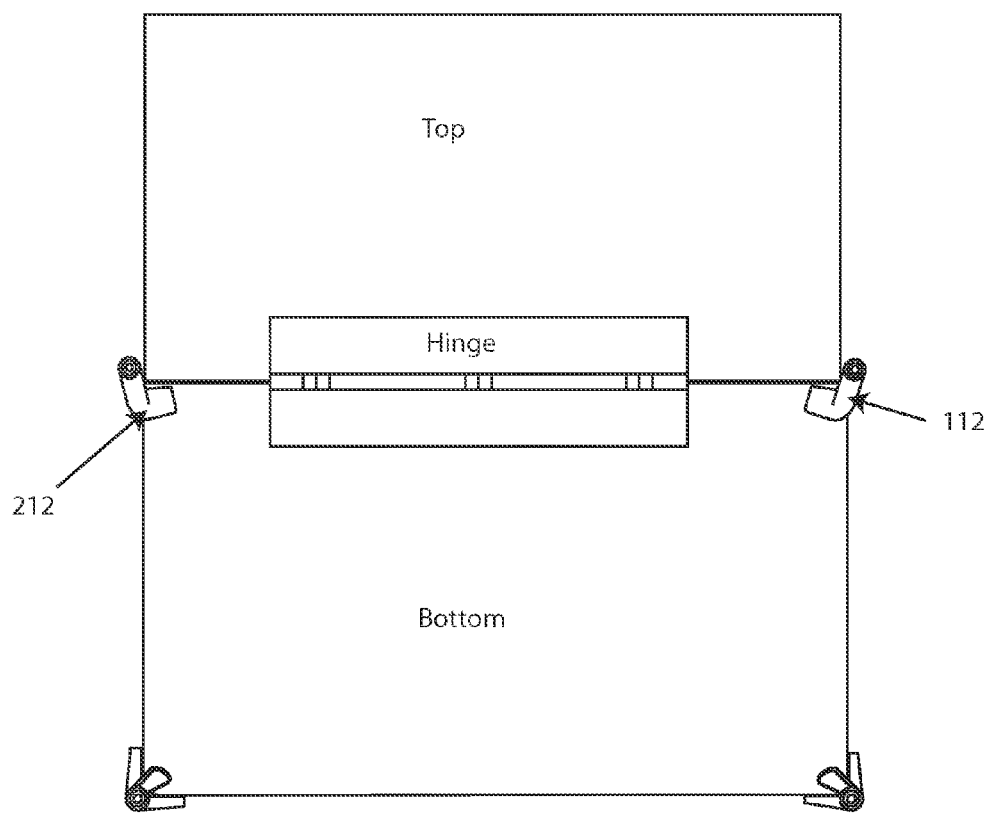
FIG. 16 is a top view of a support.

Referring now to FIG. 16, a support is shown that is used to support a hinged object, such as a laptop. Some hinged objects may be supported with the supports described in the previous figures. Other objects require an alternate support, such as the one shown here. The primary difference between the supports shown in the previous figures and the support shown here are the latches, specifically, the use of extended latch 112 and adjacent extended latch 212. Said extended latches are referred to as L-shaped, but this nomenclature does not limit the shape of the extended latches to 90 degrees. Further, the support shown may be required for devices that include two separate surfaces, such as a monitor and a keyboard, that are attached by means other than a hinge, such as a ball and socket joint.

Figure 17A:
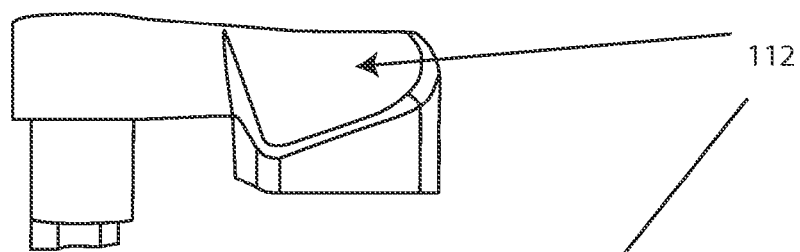
FIG. 17a is a front view of a latch.
Figure 17B:
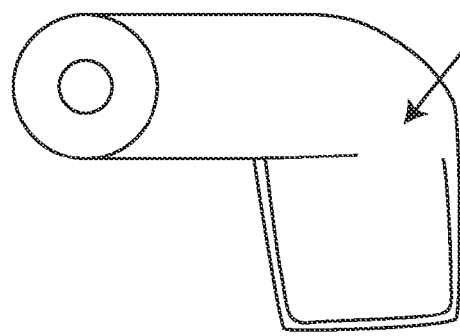
FIG. 17b is a top view of a latch.

Referring now to FIGS. 17a-b, extended latch 112 is shown. Extended latch 112 has many of the same features as rotating latch 110, except that the part of the latch that interacts with the object being supported (the interaction part) is part of an extension that extends outward from the latches rotation axis (extension part) such that an angle is created between said interaction part and said extension part, creating a general L-shape. Said interaction part has the same design features as latch arm 116. Adjacent extended latch 212 is defined relative to extended latch 112 in the same manner that adjacent rotating latch 210 is defined relative to rotating latch 110.

Figure 18A:
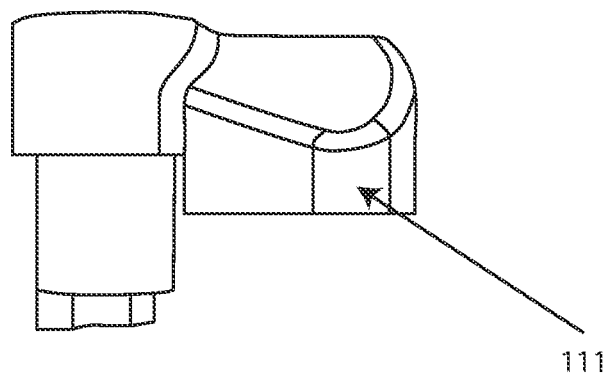
FIG. 18a is a front view of a latch.

Referring now to FIG. 18a, tall latch 111 is shown. Some objects have crevices and voids along the sides, and when said objects are placed into a support using a standard rotating latch 110 (or 210) the bottom edge corner (identified in FIG. 10f) of the latch will be forced inside said crevice or void due to the torque force imparted onto the latch by means for providing creating an equilibrium state or means for returning the latch to the equilibrium state. In an embodiment where the support is used with objects having said crevices, tall latch 111 may be used so that the bottom edge of the latch will not find said crevices. Tall latch 211 is defined relative to tall latch 111 in the same manner that adjacent rotating latch 210 is defined relative to rotating latch 110.

Figure 18B:
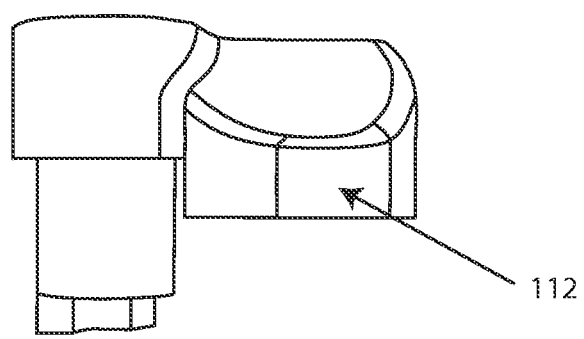
FIG. 18b is a front view of a latch; and,
FIG. 19 is a perspective view of a support in use.

Referring now to FIG. 18b, tall, wide latch 112 is shown. Tall wide latch 112 is used when the object being supported has relatively large opening or voids in the location where the latch is being used. For example, a latch would get stuck inside an Ethernet port as the object was being placed into the support if the object had an Ethernet port in a particular location. To address this issue tall wide latch 112 can be used, where the latch arm's bottom surface is extended downwardly. Tall wide latch 212 is defined relative to tall latch 112 in the same manner that adjacent rotating latch 210 is defined relative to rotating latch 110.

Figure 19:
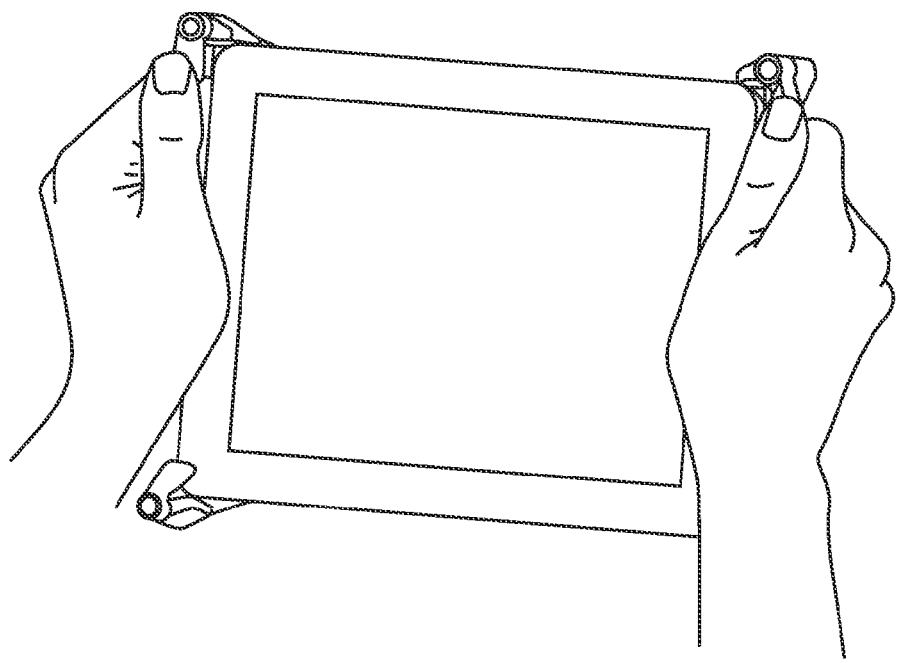

Finally, referring to FIG. 19, human hands are shown removing the object from the support. One of the advantages of the present invention is the ability to remove the device from the support with very little effort, and in an ergonomic fashion. Further advantages of the present invention include, without limitation, a support for flat rigid objects that accept said objects almost instantaneously, securing the object, and allowing for the object to be removed easily, with very little force required from the hands of the user.

In broad embodiment, the present invention is a mount that accepts an objects corners using rotating latches and cornerpieces.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

I claim:

1. A push-to-hold mount for releasably securing an object comprising:
   A base;
   at least two latch arms pivotally attached to said base, each of said at least two latch arms having an axis of rotation substantially perpendicular to the same two-dimensional plane, said at least two latch arms having bottom surfaces substantially on said two-dimensional plane, and each of said at least two latch arms being positioned on a different corner of a four-sided polygon;
   means for creating an equilibrium state for said at least two latch arms, wherein each of said at least two latch arms are positioned within the space defined by a four-sided polygon when in said equilibrium state;
   means for returning said latch arms to said equilibrium state;
   means for providing a space between said bottom surfaces and said base;
   said at least two latch arms having a top surface, said top surface having means for translating a part of a linear force into a resultant torque force about said axis of rotation;
   means for compression attached to said base and positioned to compress and press said object against said bottom surfaces when said object is placed on said two-dimensional plane.

2. The push-to-hold mount of claim 1, comprising a total of four latch arms each positioned on a corner of said four-sided polygon.

3. The push-to-hold mount of claim 1 wherein said base further includes means for mounting said base to another object.

4. The push-to-hold mount of claim 1, further comprising:
   at least two L-shaped cornerpieces attached to said base, each positioned at, and aligned with, a corner of said four-sided polygon, wherein each of said at least two L-shaped cornerpieces has means for one of said at least two latch arms to be positioned at the corner of said at least two L-shaped cornerpieces.

5. The push-to-hold mount of claim 4, wherein said base includes means for adjusting the position of said at least two L-shaped cornerpieces.

6. The push-to-hold mount of claim 1, wherein said means for translating a part of a linear force is at least in part an inclined plane.

7. The mount of claim 6, wherein said at least two latch arms are mirror images of each other.

8. The push-to-hold mount of claim 1 further comprising means for providing audio attached to said base.

9. The push-to-hold mount of claim 1 further comprising means for supporting a keyboard attached to said base.

10. The push-to-hold mount of claim 1 wherein said base is attached to a mechanical arm.

11. The push-to-hold mount of claim 1 wherein said base further includes at least one bracket having a fixed surface on said two-dimensional plane and a gap between said fixed surface and said base.

12. A catch for holding a corner of an object comprising:
   an L-shaped cornerpiece having a cavity with a generally cylindrical shape that extends through said L-shaped cornerpiece;
   a latch having a post and an arm, wherein said post has a generally cylindrical shape so that said post generally fits inside said cavity, said latch having a hole through it substantially axially aligned with said post, and said arm extending outwardly and generally perpendicularly from one end of said post, said arm having a top surface that is generally an inclined plane;
   said post and said cavity having rotation limiters that limit the rotation of said latch when said post is inside said cavity;
   a torque spring inside said cavity positioned to exert a torque force on said post, said torque spring and said rotation limiters creating an equilibrium state having a first arm position and allowing for the latch to rotate in one direction upon contact with an external force, and said torque spring returning said arm to said first arm position once said external force is removed;
   an axle inserted into said cavity and said hole, said axle having a shape that does not allow for the axle to travel through said cavity or said hole;
   a fastener connecting to said axle, and having a shape that does not allow for the fastener to travel through said cavity or said hole, thereby sandwiching said latch, said L-shaped cornerpiece and said torque spring together.

13. The catch of claim 12, further comprising a cornerpiece having a base, said base having means for compression.

14. The catch of claim 12, wherein said arm has a general L-shape.

15. The catch of claim 12, wherein said arm has a bottom surface that extends downwardly.

* * * * *